(12) United States Patent
Chen et al.

(10) Patent No.: US 9,391,169 B2
(45) Date of Patent: Jul. 12, 2016

(54) THIN FILM TRANSISTOR AND MANUFACTURING METHOD THEREOF AND DISPLAY COMPRISING THE SAME

(71) Applicant: EverDisplay Optronics (Shanghai) Limited, Shanghai (CN)

(72) Inventors: Weiting Chen, Shanghai (CN); Chunchieh Huang, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 143 days.

(21) Appl. No.: 14/184,250

(22) Filed: Feb. 19, 2014

(65) Prior Publication Data

US 2014/0353689 A1  Dec. 4, 2014

(30) Foreign Application Priority Data

May 31, 2013  (CN) .......................... 2013 1 0212002

(51) Int. Cl.
| | | |
|---|---|---|
| *H01L 29/786* | (2006.01) | |
| *H01L 21/336* | (2006.01) | |
| *H01L 29/66* | (2006.01) | |
| *H01L 21/02* | (2006.01) | |
| *H01L 29/49* | (2006.01) | |

(52) U.S. Cl.
CPC ...... *H01L 29/66742* (2013.01); *H01L 21/0217* (2013.01); *H01L 29/4908* (2013.01); *H01L 29/78669* (2013.01); *H01L 29/78678* (2013.01)

(58) Field of Classification Search
CPC .................. H01L 29/78663; H01L 29/78669; H01L 29/78672; H01L 29/78678; H01L 21/0217; H01L 21/02274; H01L 21/3185; H01L 21/28282; H01L 21/02211; H01L 21/0228; H01L 21/022; H01L 21/02532; H01L 29/04; H01L 29/4908; H01L 29/518; H01L 29/66765; H01L 29/7843; H01L 29/78696; H01L 29/792; C23C 16/345

See application file for complete search history.

(56) References Cited

U.S. PATENT DOCUMENTS 5,620,910 A * 4/1997 Teramoto .......... H01L 21/28202
257/E21.268
2009/0159884 A1* 6/2009 Oda .................. H01L 29/66765
257/57

(Continued)

FOREIGN PATENT DOCUMENTS

| JP | 2009152293 A | 7/2009 |
|---|---|---|
| JP | 2011186424 A | 9/2011 |

OTHER PUBLICATIONS

Office Action issued Jan. 22, 2015 by the TW Office.

*Primary Examiner* — Eric Ward
(74) *Attorney, Agent, or Firm* — Yungling Ren; Eaton & Van Winkle

(57) ABSTRACT

Provided is a TFT with an improved gate insulator, having an insulator substrate, a gate layer, a gate insulator layer, a active semiconductor layer, and a source and drain electrode layer, wherein the gate insulator layer includes a first silicon nitride film, a second silicon nitride film disposed on the first silicon nitride film and a third silicon nitride film disposed on the second silicon nitride, and compared to the second silicon nitride film, each of the first silicon nitride film and the third silicon nitride film is much thinner and has a lower content of N—H bond. Also provided is a display including said TFTs. According to the present disclosure, an improved gate insulator layer capable of withstanding higher voltage can be achieved due to the laminated structure and accordingly a TFT with excellent reliability can be formed.

20 Claims, 2 Drawing Sheets

(56) References Cited

U.S. PATENT DOCUMENTS

| | | | |
|---|---|---|---|
| 2011/0057248 A1* | 3/2011 | Ma | H01L 29/4234 257/324 |
| 2012/0104403 A1* | 5/2012 | Kohno | H01L 21/0217 257/66 |
| 2014/0167032 A1* | 6/2014 | Jo | H01L 27/124 257/43 |

* cited by examiner

THIN FILM TRANSISTOR AND MANUFACTURING METHOD THEREOF AND DISPLAY COMPRISING THE SAME

CROSS-REFERENCE TO RELATED APPLICATIONS

This application claims the benefit of Chinese Patent Application No. 201310212002.2, filed on May 31, 2013 and entitled "THIN FILM TRANSISTOR AND MANUFACTURING METHOD THEREOF AND DISPLAY COMPRISING THE SAME", the content of which is incorporated by reference herein in its entirety.

TECHNICAL FIELD

The present application relates to the field of semiconductor, and particularly to a thin film transistor (TFT) with an improved gate insulator, a manufacturing method thereof, and a display comprising the same.

BACKGROUND

Currently, a majority of flat panel displays such as LCD, OLED are electrically driven by active-matrix driving system, which typically includes TFT as the switching element. The properties of TFT have great effect on the quality of the display. A reliable TFT with high breakdown voltage and low current leakage is useful to decrease the number of unacceptable displays.

A TFT typically includes an insulating substrate layer, a gate layer, a gate insulator layer, an active semiconductor layer, and a source and drain electrode layer. As the flat panel displays with lower power consumption is developed recently, TFT as the switching element is accordingly required to further lower the power consumption. Thinning the gate insulator film is effective to lower the TFT threshold voltage and thus reduces the power consumption. However, defects such as micro-cracks, pinholes are prone to appear associated with thinning the gate insulator film. These defects provide current leakage paths, which may cause the breakdown voltage lowered, the current leakage increased or even cause TFT short.

To solve this problem, various methods have been proposed in many different kinds of materials such as patents and applications. For example, a Chinese Patent Application (No. 101300681A) discloses a double-layered gate insulator with a silicon oxide film and a silicon nitride film stacked together. As silicon nitride is a high dielectric constant material, the double-layered structure composed of a silicon oxide layer and a silicon nitride layer can facilitate TFT to withstand much higher voltage. However, both complexity and cost of fabricating the two layered structure will increase, because two different chambers are required to respectively deposit the silicon oxide film and the silicon nitride film. Additionally, the interfacial combination between the two layers of different materials may be a concern. Another Chinese Patent Application (No. 101034702A) discloses a gate insulator having a silicon nitride multi-layer laminated structure. The inventor declares that the current leakage can be avoided, as defects in each layer of the multi-layer laminated structure can be randomly arranged and not readily in communication with each other to form the leakage current paths. However, this disclosure may be considered as an ideal conceive.

Thus, there is still a demand for a method for effectively improving the reliability of a gate insulator, a TFT including the reliable gate insulator with low current leakage and high breakdown voltage, and a display including the TFT with high quality and yield.

The above information disclosed in this background section is only for enhancement of understanding of the background of the disclosure and therefore it may contain information that does not form the prior art that is already known to a person of ordinary skill in the art.

SUMMARY OF THE INVENTION

An object of the present disclosure is to provide a thin film transistor and a method for making the same, to solve above-mentioned and other problems.

One of the features provided by one embodiment of the present disclosure provides a TFT with an improved gate insulator, comprising an insulator substrate, a gate layer, a gate insulator layer, an active semiconductor layer, and a source and drain electrode layer, wherein the gate insulator layer includes a first silicon nitride film, a second silicon nitride film disposed on the first silicon nitride film and a third silicon nitride film disposed on the second silicon nitride, wherein each of the first silicon nitride film and the third silicon nitride film is much thinner and has a lower content of N—H bond when compared with the features of the second silicon nitride film.

According to one embodiment of the disclosure of the present invention, the contents of N—H bond in the first, second and third silicon nitride films respectively are defined as a first predetermined value, a second predetermined value and a third predetermined value respectively, and the first predetermined value and the third predetermined value is smaller than that of the second predetermined value.

According to another embodiment of the disclosure of the present invention, the first predetermined value and the third predetermined value are each independently smaller than 15%, and the second predetermined value is greater than 20%.

According to another embodiment of the disclosure of the present invention, the thickness of each of the first silicon nitride film and the third silicon nitride film is in a range from 60 to 100 Å, and the thickness of the second silicon nitride film is in a range from 500 to 700 Å.

According to another embodiment of the disclosure of the present invention, a method of making a TFT with an improved gate insulator as described above is provided, which comprises the steps of:

forming a gate on an insulating substrate;

forming a laminated gate insulator layer on the gate, the gate insulator being composed of a first silicon nitride film, a second silicon nitride film and a third silicon nitride film;

forming an active semiconductor layer on the gate insulator layer; and forming a source and drain electrode layer on the active semiconductor layer to obtain the TFT.

According to another embodiment of the disclosure of the present invention, the first silicon nitride film, the second silicon nitride film and the third silicon nitride film are successively formed by chemical vapor deposition (CVD) using the same feed gases at the same deposition temperature with a first power, a second power and a third power respectively in the same chamber, and the first power and the third power are lower than that of the second power.

According to another embodiment of the disclosure of the present invention, the feed gases are $SiH_4$, $NH_3$ and $N_2$, the flow ratio of $SiH_4$ to $NH_3$ is 0.2-0.4.

According to another embodiment of the disclosure of the present invention, the deposition temperature is 340-380° C.

According to another embodiment of the disclosure of the present invention, the first power may be the same as that of the third power.

According to another embodiment of the disclosure of the present invention, the first power and the third power are 1500-2000 W, and the second power is 3000-5000 W.

According to another embodiment of the disclosure of the present invention, the first silicon nitride film, the second silicon nitride film and the third silicon nitride film are successively formed by chemical vapor deposition (CVD) under the same deposition temperature and power using the same feed gases with a first feed gas ratio, a second feed gas ratio and a third feed gas ratio respectively in the same chamber.

According to another embodiment of the disclosure of the present invention, each of the first feed gas ratio, the second feed gas ratio and the third feed gas ratio is the flow ratio of $SiH_4$ to $NH_3$, and the first feed gas ratio and the third feed gas ratio are greater than that of the second feed gas ratio.

According to another embodiment of the disclosure of the present invention, the first feed gas ratio and the third feed gas ratio may be the same.

According to another embodiment of the disclosure of the present invention, the first feed gas ratio and the third feed gas ratio are 0.2-0.4.

According to another embodiment of the disclosure of the present invention, the first feed gas ratio and the third feed gas ratio are 0.2.

According to another embodiment of the disclosure of the present invention, the second feed gas ratio is 0.05-0.1.

According to another embodiment of the disclosure of the present invention, the second feed gas ratio is 0.1.

According to another embodiment of the disclosure of the present invention, the contents of N—H bond in the first, second and third silicon nitride film are defined as a first predetermined value, a second predetermined value and a third predetermined value respectively, and the first predetermined value and the third predetermined value is smaller than that of the second predetermined value.

According to another embodiment of the disclosure of the present invention, the first predetermined value and the third predetermined value are each independently smaller than 15%, and the second preset value is greater than 20%.

According to another aspect of the present disclosure, a display including the TFTs as described above is provided.

According to another embodiment of the disclosure of the present invention, the display is a LCD.

According to another embodiment of the disclosure of the present invention, the display is an OLED.

According to another aspect of the present disclosure, a thin film transistor is provided, which comprises: an insulator substrate, a gate over the insulator substrate, a gate insulator layer over the gate, an active semiconductor layer over the gate insulator layer, and a source and drain electrode layer over the active semiconductor layer, wherein the gate insulator layer comprises: a first silicon nitride film having a first thickness, a second silicon nitride film disposed on the first silicon nitride film and having a second thickness larger than that of the first silicon nitride film, and a third silicon nitride film disposed on the second silicon nitride and having a thickness smaller than that of the second silicon nitride film, wherein the N—H bond content of the third silicon nitride film is lower than that of the second silicon nitride film.

According to another aspect of the present disclosure, a method for making a thin film transistor is provided, which comprises the steps of: forming a gate on an insulating substrate; forming a first silicon nitride film on the gate layer; forming a second silicon nitride film on the first silicon nitride film, wherein the second silicon nitride film is higher than the first silicon nitride film in thickness and the N—H bond content of the second silicon nitride film is higher than that of the first silicon nitride film; forming a third silicon nitride film on the second silicon nitride film, wherein the third silicon nitride film is lower than the second silicon nitride film in thickness and the N—H bond content of the third silicon nitride film is lower than that of the second silicon nitride film; forming an active semiconductor layer on the third silicon nitride film; and forming a source and drain electrode layer on the active semiconductor layer.

According to another aspect of the present disclosure, a display including the thin film transistor as described above is provided.

According to the present disclosure, the gate insulator layer is configured to be a three-layer silicon nitrate laminated structure, and the content of N—H bond in each of the silicon nitrate films is controlled by adjusting the film preparation conditions to form three films with different densities. Specifically, a laminated gate insulator layer is formed, including a dense first silicon nitrate film, a loose second silicon nitrate film and a dense third silicon nitrate film stacked on top of one another. In the laminated gate insulator layer, the second silicon nitrate film with lower density sandwiched between the first and third silicon nitrate films has a much higher thickness, serving as the major part of the gate insulator layer, allowing a higher yield capacity to be achieved. While, the first and third silicon nitrate films with higher density have a smaller thickness, serving as the protective films for the loose second silicon nitrate film. The dense first and third silicon nitride films with fewer defects are contacted with the gate layer and the active semiconductor layer, such that the increase of the leakage current and the decrease of the breakdown voltage associated with a great deal of defects can be effectively avoided. Consequently, the reliability of TFT can be improved. Additionally, since three layers of silicon nitrate are formed successively in the same chamber using the same feed gases, the complexity and cost of the process will not be raised. Further, three films of the laminated gate insulator layer are all composed of silicon nitride, allowing the excellent interfacial combination between the films.

The foregoing summary is not intended to summarize each potential embodiment or every aspect of the present disclosure.

BRIEF DESCRIPTION OF THE DRAWINGS

The foregoing and other features and advantages of the disclosure will be apparent to those skilled in the art in view of the following detailed description, taken in conjunction with the accompanying drawings.

DETAILED DESCRIPTION

Figure 1:
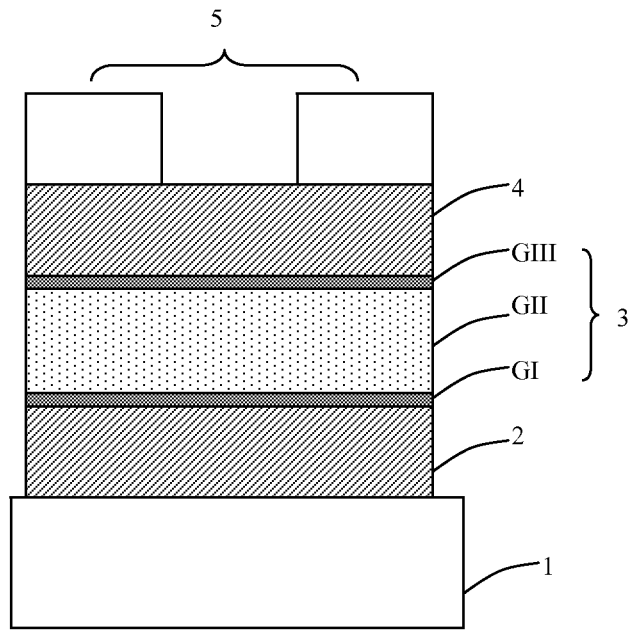
FIG. 1 is a schematic view showing the structure of TFT with an improved gate insulator layer according to the present disclosure.

Exemplary embodiments of the disclosure will now be described more fully with reference to the accompanying drawings, in which exemplary embodiments are shown. Exemplary embodiments of the disclosure may, however, be embodied in many different forms and should not be construed as being limited to the embodiments set forth herein; rather, these embodiments are provided so that this disclosure will be thorough and complete, and will fully convey the concept of exemplary embodiments to those skilled in the art. In the drawings, the thicknesses of layers and regions are exaggerated for clarity. Like reference numerals in the drawings denote like elements, and thus their description will be omitted.

Hereinafter, a TFT with an improved gate insulator layer according to the present disclosure will be described with reference to FIG. 1. The TFT comprises a insulating substrate 1, a gate layer 2, a gate insulator layer 3, an active semiconductor layer 4, and a source and drain electrode layer 5, wherein the gate insulator layer 3 includes a first silicon nitride film GI, a second silicon nitride film GII disposed on the first silicon nitride film and a third silicon nitride film GIII disposed on the second silicon nitride, and compared to the second silicon nitride film GII, each of the first silicon nitride film GI and the third silicon nitride film GIII is much thinner and has a lower content of N—H bond.

According to the invention, a high dielectric constant material of silicon nitride is used for forming the gate insulator layer, which is effective to improve the resistance to higher voltage. In view of the capacity and the charging characteristics of TFT, the gate insulator layer is required to have a greater thickness, that is preferably 500-700 Å. In order to improve the yield, said layer is usually deposited at higher deposition rate, which may cause the resulted silicon nitride film loose and having many defects such as stress deformation, dislocation and fault. Thus, according to the invention, a silicon nitride film that is looser and thicker serves as the major part of the gate insulator layer, and two dense silicon nitride films with little defects are arranged on both sides of said major part as the protective layers, wherein the thickness of two protective silicon nitride films is preferably 60-100 Å. Due to the laminated structure of the gate insulator layer according to the invention, the problem that the breakdown voltage is lowered and the leakage current is increased, which may occur because of a great deal of defects in the major part, can be effectively avoided.

The silicon nitride films are preferably prepared using $SiH_4$, $NH_3$ and $N_2$ as the feed gases. The prepared films typically comprise N—H bond, Si—H bond, Si—Si bond and Si—N bond. Compared to the short-range bond such as Si—Si and Si—N, the long-range bond such as N—H and Si—H has weak stability. Therefore, if the silicon nitride film contains increased amount of N—H bond or Si—H bond, the density of the film will be worse. Consequently, the mechanical strength and the dielectric properties of the film will be degraded accordingly. In view of the relation between the content of N—H bond and the density of the silicon nitride film, the inventor is intended to form a laminated structure having three layers of silicon nitrate films with different density via controlling the content of N—H bond in each film. According to the invention, the first silicon nitride film and the third silicon nitride film have fewer N—H bond than the second silicon nitride film. Specifically, the second silicon nitride film, which is sandwiched between the first and third film as the major part of the gate insulator, contains more of N—H bond, preferably over 20%, and thus has relatively worse density. As a loose film can be formed at much higher deposition rate, the productivity of the whole gate insulator having a laminated structure can be insured. In contrast, the first silicon nitride film and the third silicon nitride film arranged on each side of said major part contain few of N—H bond, preferably lower than 15%, and thus have much higher density. Thereby, the breakdown due to too many defects in the loose major part can be effectively avoided under the protection of the dense first and third film.

Also provided is a method for making the TFT as described above. According to the invention, each of the silicon nitride films can be formed by various chemical vapor deposition methods (CVD), such as LPCVD, TCVD, CCVD and PECVD. PECVD is a low-temperature thin film preparation method, which is very suitable for forming the semiconductor films and preferably used in the invention. Said three silicon nitride films of the laminated gate insulator layer can be successively deposited in one chamber using the same feed gases by PECVD.

With regard to the feed gases, nitrogen containing feed gases can be one or more selected from $NH_3$, $NH_2H_2N$ and $N_2$, preferably NH and $N_2$, and silicon containing feed gases can be one or more selected from $SiH_4$, $Si_2H_6$, $SiCl_4$, $SiHCl_3$, $SiH_2Cl_2$, $SiH_3Cl_3$ and $SiF_4$, preferably $SiH_4$.

The content of N—H bond in the resulted silicon nitride film can be controlled by adjusting the operation conditions. For example, different contents can be achieved in each film by applying different deposition powers with the same feed gases and deposition temperature, or by employing different flow ratios of the feed gases with the same feed gases and deposition power.

In one embodiment, the first, second and third silicon nitride film are each independently deposited with a first power, a second power and a third power, respectively, wherein the first power and the third power are lower than the second power. Therefore, the first, second and third silicon nitride film can achieve a first, second and third preset amount of N—H bond, respectively, and accordingly the first preset amount and the third preset amount are smaller than the second preset amount. Specifically, the first and third power can be same or different, and preferably be 1500-2000 W, and the second power can be preferably 3000-5000 W. Consequently, a first and third preset amount of N—H bond lower than 15% and a second preset amount of N—H bond more than 20% can be achieved. In other embodiment, the first, second and third silicon nitride film are each independently deposited with a first, second and third flow ratio of the feed gases, respectively, wherein the flow ratio of the feed gases is defined as the flow ratio of $SiH_4$ to $NH_3$, and the first flow ratio and the third flow ratio are higher than the second flow ratio. Similarly, the first, second and third silicon nitride film can achieve a first, second and third preset amount of N—H bond, respectively, and accordingly the first preset amount and the third preset amount are smaller than the second preset amount. Specifically, the first and third flow ratio can be preferably 0.2-0.4, more preferably 0.2, and the second flow ratio can be preferably 0.05-0.1, more preferably 0.1. A first and third preset amount of N—H bond lower than 15% and a second preset amount of N—H bond more than 20% also can be achieved.

It should be noted that, the insulating substrate, the gate layer, the active semiconductor layer and the source and drain electrode layer of TFT according to the present disclosure are not specifically limited. For example, the insulating substrate can be made from glass or quartz; the active semiconductor layer can be made from amorphous silicon or polycrystalline silicon; and the gate layer and the source and drain electrode layer can be each independently made from Al, Mo, Cr, W, Ta or Ti.

Therefore, an improved gate insulator layer capable of withstanding higher voltage can be achieved due to the laminated structure according to the present disclosure, and accordingly a TFT with excellent reliability can be formed.

Still also provided is a display including the TFT as described above. As the switching element for the display, a reliable TFT with high breakdown voltage and low leakage current is useful to decrease the yield of unacceptable displays and increase the quality of the displaying. According to the present disclosure, the display is preferably a LCD or an OLED that is suitable for applying TFTs as the switching elements, The terms used herein each have usual means appreciated by the skilled person in the art, except otherwise indicated.

The present disclosure will be described in more detail with reference to the drawings and examples. It should be understood that the examples are provided for illustrating rather than limiting the present application.

Example 1

Figure 2:
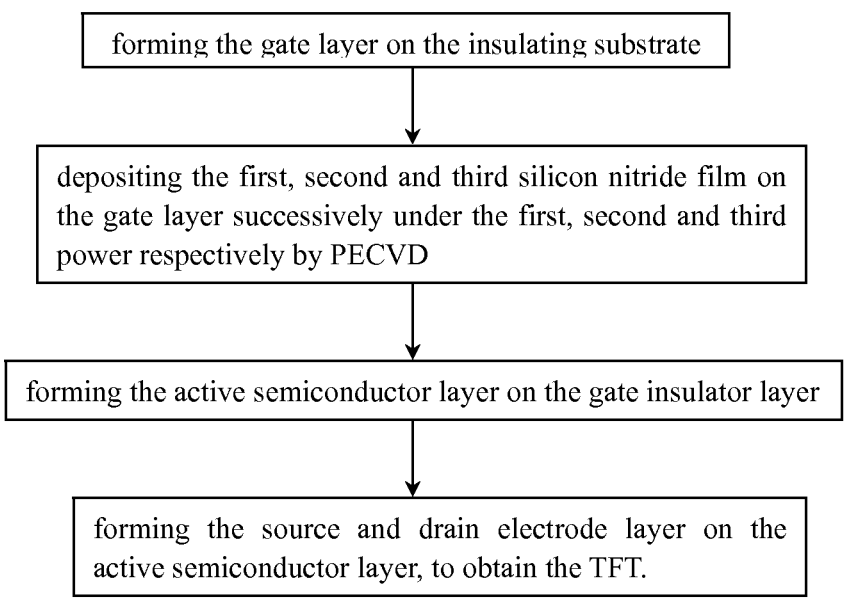
FIG. 2 is a flow chart diagram of the method for making the TFT according to Example 1 of the present disclosure.

In this example, the insulating substrate, the gate layer, the active semiconductor layer and the source and drain electrode layer of the TFT were made from glass, Mo—Al—Mo laminated films, polycrystalline silicon and Al, respectively. The gate insulator layer was formed by depositing three silicon nitride films successively via PECVD with the same feed gases and deposition temperature under different powers to control the content of N—H bond in each film. With reference to FIG. 2, the preparation of the gate insulator layer will be described in detail below.

In a vacuum chamber, low-temperature plasma was generated under a RF of 13.56 MHz as the energy source for the gas reaction. Next, the feed gases of $SiH_4$, $NH_3$ and $N_2$ were introduced, and the flow ratio of $SiH_4$ to $NH_3$ was set up to 0.2. The first silicon nitride film then was deposited on the glass substrate having a formed gate pattern under the temperature of 360° C. and the power of 2000 W. Finally, the first film with a thickness of 80 Å was obtained.

In the same chamber, the second silicon nitride film was subsequently deposited on the resulted first film under the same operation conditions as those of the first film, except that the deposition power was increased to 5000 W. Finally, the second film with a thickness of 600 Å was obtained.

Following, still in the same chamber, the third silicon nitride film with a thickness of 80 Å was subsequently deposited on the resulted second film under the same operation conditions as those of the first film. Finally, the TFT according to the present disclosure was obtained.

The bonding states of elements in each film were determined by Fourier transform infrared spectroscopy. Based on the Fourier transform infrared absorption spectroscopy, the contents of N—H bond in each film were determined. As a result, the first, second and third film had 12%, 22% and 11% of N—H bond, respectively. Thus, it was revealed that, according to the process, a laminated gate insulator layer composed of three silicon nitride films with different contents of N—H bond can be formed. Further, the resulted gate insulator layer was subjected to the electrical tests. The results showed that the leakage current through the layer was 1E-7 [$A/cm^2$] and the breakdown voltage was 48 V. It can be seen that the gate insulator layer according to Example 1 of the present disclosure has improved electrical properties and can provide the TFT including the same higher reliability.

Example 2

Figure 3:
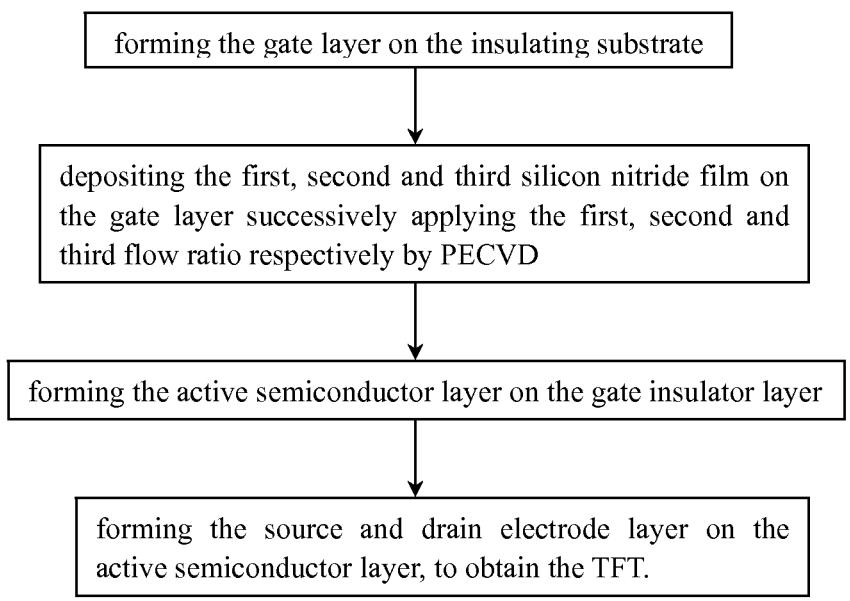
FIG. 3 is a flow chart diagram of the method for making the TFT according to Example 1 of the present disclosure.

In this example, the insulating substrate, the gate layer, the active semiconductor layer and the source and drain electrode layer of the TFT were made from glass, Mo—Al—Mo laminated films, polycrystalline silicon and Al, respectively. The gate insulator layer was formed by depositing three silicon nitride films successively via PECVD with the same feed gases, deposition temperature and power applying different flow ratios of the feed gases to control the content of N—H bond in each film. With reference to FIG. 3, the preparation of the gate insulator layer will be described in detail below.

In a vacuum chamber, low-temperature plasma was generated under a RF of 13.56 MHz as the energy source for the gas reaction. Next, the feed gases of $SiH_4$, $NH_3$ and $N_2$ were introduced, and the first flow ratio of $SiH_4$ to $NH_3$ was set up to 0.2. The first silicon nitride film then was deposited on the glass substrate having a formed gate pattern under the temperature of 360° C. and the power of 4000 W. Finally, the first film with a thickness of 80 Å was obtained.

In the same chamber, the second silicon nitride film was subsequently deposited on the resulted first film under the same operation conditions as those of the first film, except that the second flow ratio of 0.1 was employed. Finally, the second film with a thickness of 600 Å was obtained.

Following, still in the same chamber, the third silicon nitride film with a thickness of 80 Å was subsequently deposited on the resulted second film under the same operation conditions as those of the first film, wherein the third flow ratio equal to the first flow ratio was employed. Finally, the TFT according to the present disclosure was obtained.

The bonding states of elements in each film were determined by Fourier transform infrared spectroscopy. Based on the Fourier transform infrared absorption spectroscopy, the contents of N—H bond in each film were determined. As a result, the first, second and third film had 13%, 24% and 12% of N—H bond, respectively. Thus, it was revealed that, according to the process, a laminated gate insulator layer composed of three silicon nitride films with different contents of N—H bond also can be formed. Further, the resulted gate insulator layer was subjected to the electrical tests. The results showed that the leakage current through the layer was 1.2E-7 [$A/cm^2$] and the breakdown voltage was 43 V. It can be seen that the gate insulator layer according to Example 2 of the present disclosure also has improved electrical properties and can provide the TFT including the same higher reliability.

Although the present disclosure has been described and illustrated in detail, it is clearly understood that the same is by way of illustration and example only and is not to be taken by way of limitation, the spirit and scope of the present disclosure being limited only by the terms of the appended claims

What is claimed is:

1. A thin film transistor, comprising:
   an insulator substrate,
   a gate layer over the insulator substrate,
   a gate insulator layer over the gate layer,
   an active semiconductor layer over the gate insulator layer, and
   a source and drain electrode layer over the active semiconductor layer,
   wherein the gate insulator layer includes:
   a first silicon nitride film,
   a second silicon nitride film disposed directly on the first silicon nitride film and having a thickness larger than that of the first silicon nitride film and N—H bond content of the second silicon nitride film being higher than that of the first silicon nitride film, and
   a third silicon nitride film disposed directly on the second silicon nitride, wherein the third silicon nitride film is lower than the second silicon nitride film in thickness and the N—H bond content of the third silicon nitride film is lower than that of the second silicon nitride film, and the third silicon nitride film directly contacts the active semiconductor layer.

2. The TFT according to claim 1, wherein the N—H bond content of the first silicon nitride film and of the third silicon nitride film are respectively smaller than 15%, and the N—H bond content of the second silicon nitride film is greater than 20%.

3. The TFT according to claim 1, wherein the thickness of each of the first silicon nitride film and the third silicon nitride film is in a range from 60 to 100 Å, and the thickness of the second silicon nitride film is in a range from 500 to 700 Å.

4. A display including the thin film transistor according to claim 1.

5. The display according to claim 4, wherein the display is a LCD or an OLED.

6. A method for making a thin film transistor, comprising the steps of:
forming a gate layer on an insulating substrate;
forming a first silicon nitride film on the gate layer;
forming a second silicon nitride film directly on the first silicon nitride film, wherein the second silicon nitride film is higher than the first silicon nitride film in thickness and the N—H bond content of the second silicon nitride film is higher than that of the first silicon nitride film;
forming a third silicon nitride film on the second silicon nitride film, wherein the third silicon nitride film is lower than the second silicon nitride film in thickness and the N—H bond content of the third silicon nitride film is lower than that of the second silicon nitride film;
forming an active semiconductor layer directly on the third silicon nitride film; and
forming a source and drain electrode layer on the active semiconductor layer.

7. The method according to claim 6, wherein the first silicon nitride film, the second silicon nitride film and the third silicon nitride film are successively formed by chemical vapor deposition using same feed gases at same deposition temperature under a first deposition power, a second deposition power and a third deposition power respectively in a chamber, and the first deposition power and the third deposition power are lower than the second deposition power.

8. The method according to claim 7, wherein the feed gases are $SiH_4$, $NH_3$ and $N_2$, and a flow ratio of $SiH_4$ to $NH_3$ is 0.2-0.4.

9. The method according to claim 7, wherein the deposition temperature is 340-380° C.

10. The method according to claim 7, wherein the first deposition power and the third deposition power are same or different.

11. The method according to claim 7, wherein the first deposition power and the third deposition power are 1500-2000 W, and the second power is 3000-5000 W.

12. The method according to claim 6, wherein the first silicon nitride film, the second silicon nitride film and the third silicon nitride film are successively formed by chemical vapor deposition under a same deposition temperature and power using a same feed gases with a first feed gas ratio, a second feed gas ratio and a third feed gas ratio respectively in a chamber.

13. The method according to claim 12, wherein the deposition power is 3000-5000 W.

14. The method according to claim 12, wherein the deposition temperature is 340-380° C.

15. The method according to claim 12, wherein the feed gases are $SiH_4$, $NH_3$ and $N_2$.

16. The method according to claim 15, wherein each of the first feed gas ratio, the second feed gas ratio and the third feed gas ratio is the flow ratio of $SiH_4$ to $NH_3$, and the first feed gas ratio and the third feed gas ratio are greater than the second feed gas ratio.

17. The method according to claim 16, wherein the first feed gas ratio and the third feed gas ratio are same or different.

18. The method according to claim 16, wherein the first feed gas ratio and the third feed gas ratio are 0.2-0.4.

19. The method according to claim 16, wherein the second feed gas ratio is 0.05-0.1.

20. The method according to claim 6, wherein the content of N—H bond in the first silicon nitride film and the third silicon nitride film are respectively smaller than 15%, and the content of N—H bond in the second silicon nitride film is greater than 20%.

* * * * *